United States Patent
Keshavarzi et al.

(10) Patent No.: US 6,459,293 B1
(45) Date of Patent: Oct. 1, 2002

(54) MULTIPLE PARAMETER TESTING WITH IMPROVED SENSITIVITY

(75) Inventors: Ali Keshavarzi, Portland, OR (US); Kaushik K. Roy, West Lafayette, IN (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 79 days.

(21) Appl. No.: 09/672,695

(22) Filed: Sep. 29, 2000

(51) Int. Cl.[7] ............................................. G01R 31/26
(52) U.S. Cl. ........................ 324/765; 324/763
(58) Field of Search ............................ 324/158.1, 765, 324/763, 537; 368/113–118; 714/733, 734, 724

(56) References Cited

U.S. PATENT DOCUMENTS

| | | | |
|---|---|---|---|
| 5,519,193 A | | 5/1996 | Freiermuth et al. |
| 5,625,300 A | * | 4/1997 | Sachdev ............... 324/765 |
| 5,757,816 A | * | 5/1998 | Al-Assadi et al. ....... 324/158.1 |
| 5,869,977 A | * | 2/1999 | Kalb, Jr. et al. ............ 324/765 |
| 5,889,408 A | | 3/1999 | Miller |
| 5,889,409 A | | 3/1999 | Kalb, Jr. |
| 5,900,641 A | | 5/1999 | Hara et al. |
| 5,914,615 A | | 6/1999 | Chess |
| 6,100,751 A | | 8/2000 | De et al. |
| 6,140,832 A | * | 10/2000 | Vu et al. ................... 324/765 |

OTHER PUBLICATIONS

Ali Keshavarzi et al., "Effectiveness of Reverse Body Bias for Low Power CMOS circuits," Bulk MOSFETs with Forward Body Bias for Sub–1V, High–Performance Technology, http://www.mrc.unm.edu/symposiums/symp99/s2/hawkins/hawkins.html, 2000, pp. 1–12.

* cited by examiner

Primary Examiner—Michael J. Sherry
Assistant Examiner—Jimmy Nguyen
(74) Attorney, Agent, or Firm—Antonelli, Terry, Stout & Kraus, LLP

(57) ABSTRACT

A method and device are provided for testing electronic devices on a chip. This may be accomplished by measuring current through a first electronic device and measuring a speed of the first electronic device. A determination may then be made whether the first electronic device is defective by comparing the measured current and the measured speed with a multi-parameter (i.e., IDDQ and FMAX) threshold level.

27 Claims, 9 Drawing Sheets

IDDQ VS FMAX AT NBB

MULTIPLE PARAMETER TESTING WITH IMPROVED SENSITIVITY

FIELD

The present invention relates to the field of testing semiconductor devices and integrated circuits for defects, and more particularly relates to testing using a multi-parameter threshold.

BACKGROUND

In the manufacture of semiconductor devices, methods are performed for testing a device and determining if it is an acceptable device or if it contains defects before selling such a product to a customer. If the results of the test are within a manufacturer's tolerance levels then the device is presumably a non-defective device and may be sold to a customer. If the results of the test are not within the manufacturer's tolerance levels then the device is a defective device and cannot be sold to a customer.

One method for testing a device for defects is IDDQ testing. IDDQ derives from quiescent IDD which is the current drawn by a VDD power supply. The VDD power supply is typically held at a voltage above ground and fixed within narrow bounds. The other power supply is typically called Vss and is taken to ground. In IDDQ testing, an electronic device may be tested by measuring the current while the device is in the quiescent state. Since defects often result in significant leakage currents, measuring the quiescent current allows defects such as gate oxide shorts, bridge detects, etc. to be detected. If the IDDQ current is above a preset threshold, then the device may be classified as defective and not sold to the customer.

However, technology scaling challenges the effectiveness of current-based techniques such as IDDQ testing. Elevated leakage current in scaled technologies increases the intrinsic leakage current of integrated circuits. This diminishes the sensitivity and degrades the required signal to noise ratio for IDDQ testing. One way to deal with this problem is to lower the intrinsic leakage current prior to performing IDDQ testing. However, leakage reduction techniques are not as favorable in aggressively scaled technologies. It is therefore desirable to find a testing solution for very fast and high performance integrated circuits that are susceptible to elevated background leakage current.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto.

The following represents brief descriptions of the drawings wherein like reference numerals represent like elements and wherein.

DETAILED DESCRIPTION

Embodiments of the present invention may provide a method for testing a plurality of electronic devices and circuits on a chip. This may include measuring current, such as leakage current, through a first electronic device, measuring a speed (such as a maximum operating frequency) of the first electronic device and determining whether the first electronic device is defective by comparing the measured current and the measured speed with a multi-parameter threshold level (also referred to hereafter as a multi-parameter threshold). The multi-parameter threshold level may be set based on correlation and dependence of IDDQ and FMAX parameters as will be described below.

In accordance with embodiments of the present invention, a multi-parameter test may be based on a leakage current to frequency relationship for a given integrated circuit (IC) product fabricated on a given technology generation. IDDQ and FMAX (i.e., the maximum operating-frequency or speed) tests are performed on today's high performance integrated circuit products. IDDQ testing may be performed for measuring the static power consumption of an IC or to detect defective ICs while FMAX may be measured to determine the speed and thus the price of integrated circuits. Embodiments of the present invention may utilize the IDDQ and FMAX parameters to create a multi-parameter testing solution for high performance integrated circuits. Embodiments of the present invention may also perform characterization operations and testing at different conditions to further improve the sensitivity (i.e., multi-parameter testing).

Figure 1:
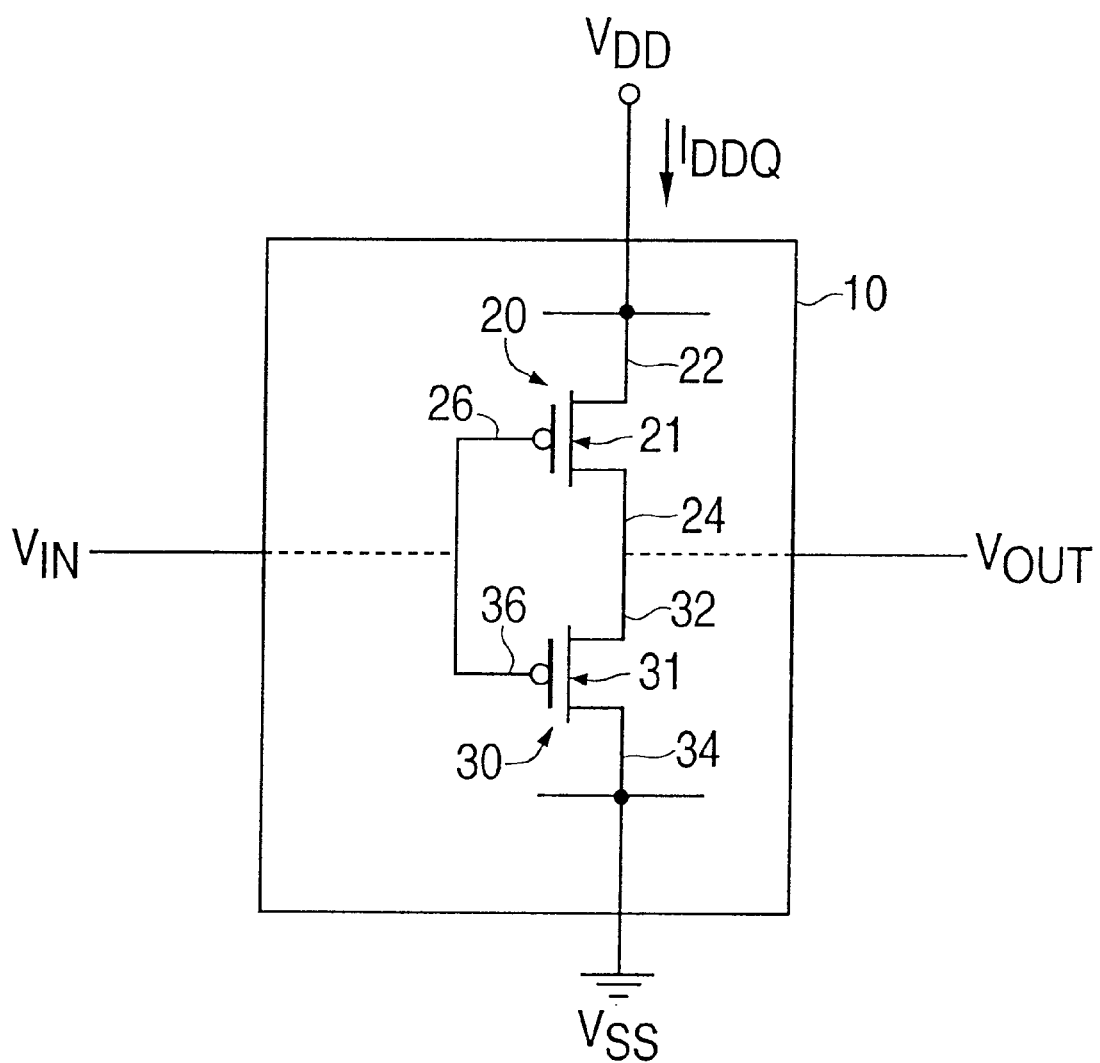
FIG. 1 shows a CMOS inverter circuit.
Figure 2:
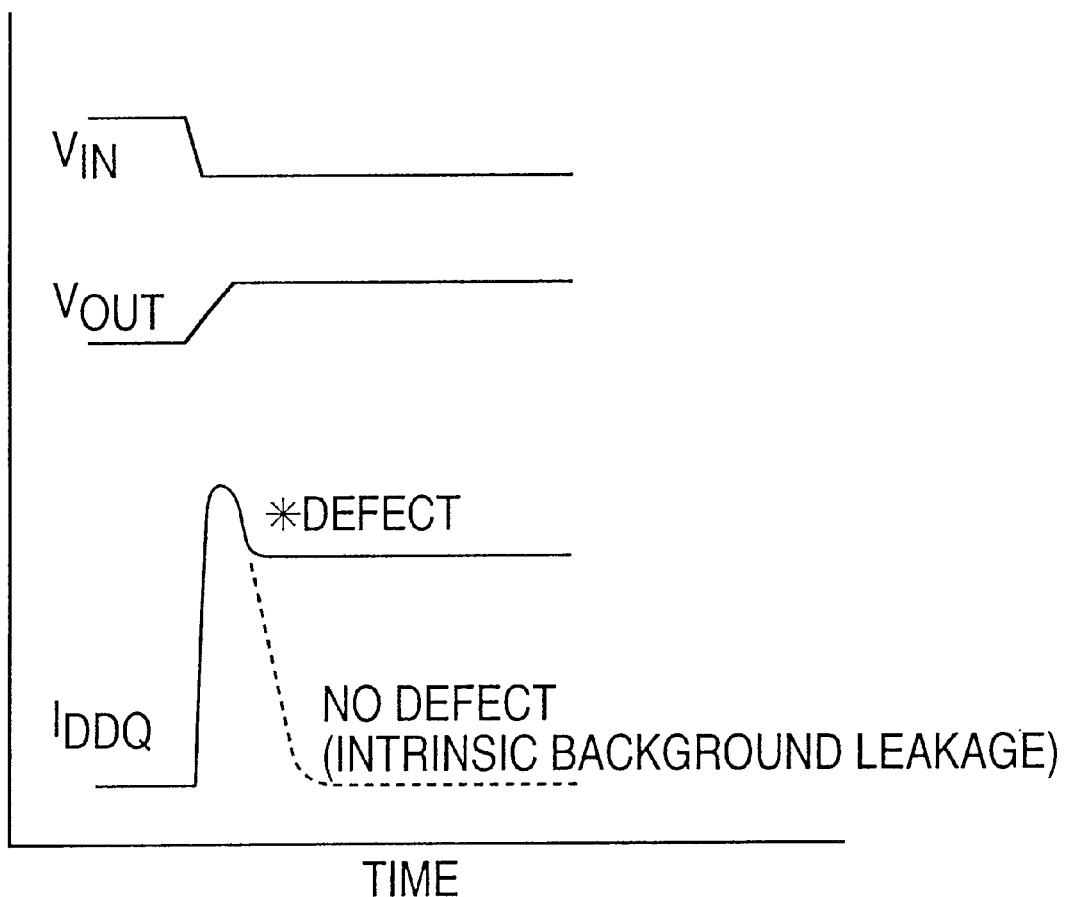
FIG. 2 is a plot of measured IDDQ for a defective CMOS circuit and a defect-free (i.e., intrinsic) CMOS circuit.

The present invention will now be described with respect to the accompanying drawings. FIG. 1 shows a complementary metal oxide silicon (CMOS) gate 10 within an integrated circuit. The CMOS gate 10 is one example of an electronic device that may be provided on a chip. Other types of electronic devices may also be provided. The CMOS gate 10 may include a PMOS transistor 20 and an NMOS transistor 30 forming an inverter circuit configuration. The PMOS transistor 20 may include a drain 22 coupled to $V_{DD}$, a source 24 coupled to a $V_{OUT}$ pin and a gate 26 coupled to a $V_{IN}$ pin. In a normal body bias mode, a body 21 of the PMOS transistor may be coupled to $V_{DD}$, which is the same potential as the drain 22. The NMOS transistor 30 may include a drain 32 coupled to the $V_{OUT}$ pin, a source 34 coupled to Vss (i.e., ground) and a gate 36 coupled to the $V_{IN}$ pin. In a normal body bias mode, a body 31 of the NMOS transistor 30 may be coupled to $V_{SS}$, which is the same potential as the source 34. FIG. 1 also shows the IDDQ current conducted by the CMOS gate 10. FIG. 2 shows input ($V_{IN}$) and output ($V_{OUT}$) waveforms of the CMOS gate 10 as well as the IDDQ current conducted by the CMOS gate 10 when there is a defect as compared to when there is not a defect (i.e., the intrinsic background leakage). In a more complex IC, an input vector may be selected for IDDQ measurement.

In accordance with embodiments of the present invention, data relating to leakage current and operating speed may be determined (or measured) for a plurality of electronic devices and circuits and stored in a database or similar type of data storage unit. More specifically, IDDQ and FMAX data may be obtained for each of the individual integrated circuits on a chip or on a plurality of chips. This may occur in any number of well known manners such as by using an IC tester. This data may also be obtained over a period of time or may be obtained on a real time basis. The measured data may be stored in the database or similar type of data storage unit. The stored data may be compared with IDDQ and FMAX parameters for an integrated circuit to determine whether an integrated circuit is defective. This differs from disadvantageous techniques that only compare the IDDQ current with a single threshold level to determine if an integrated circuit is defective.

Figure 3:
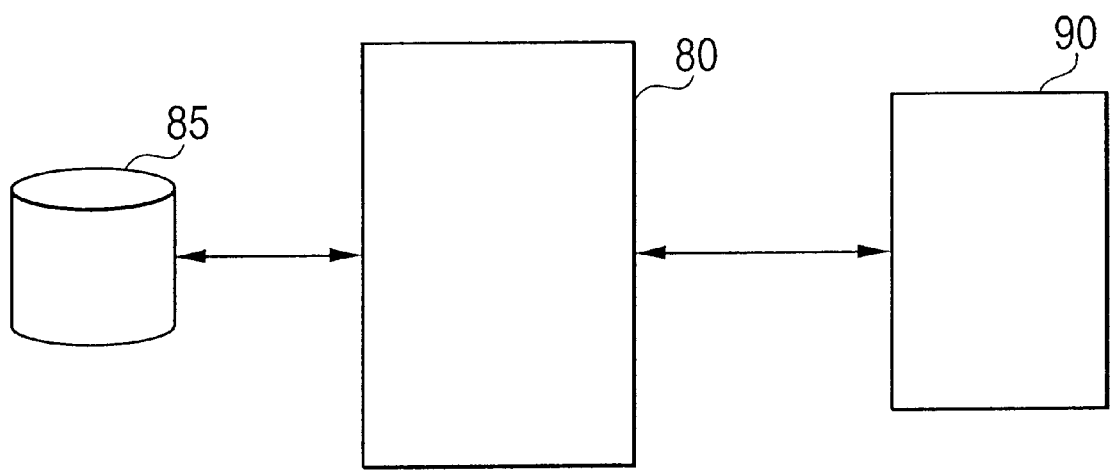
FIG. 3 is a block diagram of a device to test electronic devices on a chip according to an example embodiment of the present invention.

FIG. 3 shows a block diagram of a device to test electronic devices on a chip according to an example embodiment of the present invention. Other embodiments and configurations are also within the scope of the present invention. FIG. 3 shows a testing device 80 (such as an IC tester having a processor), a device under test 90 and a database 85. Operations of these devices will become apparent from the discussion below. In summary, the testing device 80 provides the stimulus to the device under test 90 and captures the response that the device under test 90 sends in return. The testing device 80 may measure current through electronic devices on a chip and may measure speed of the electronic devices. The processor may be provided with or be coupled to the testing device 80 so as to receive data relating to the measured current and the measured speed. The testing device 80 may interface with the database 85 or other type of data storage unit to store the data. The processor may compare the measured data with a multi-parameter threshold level as will be described below in greater detail.

Figure 4:
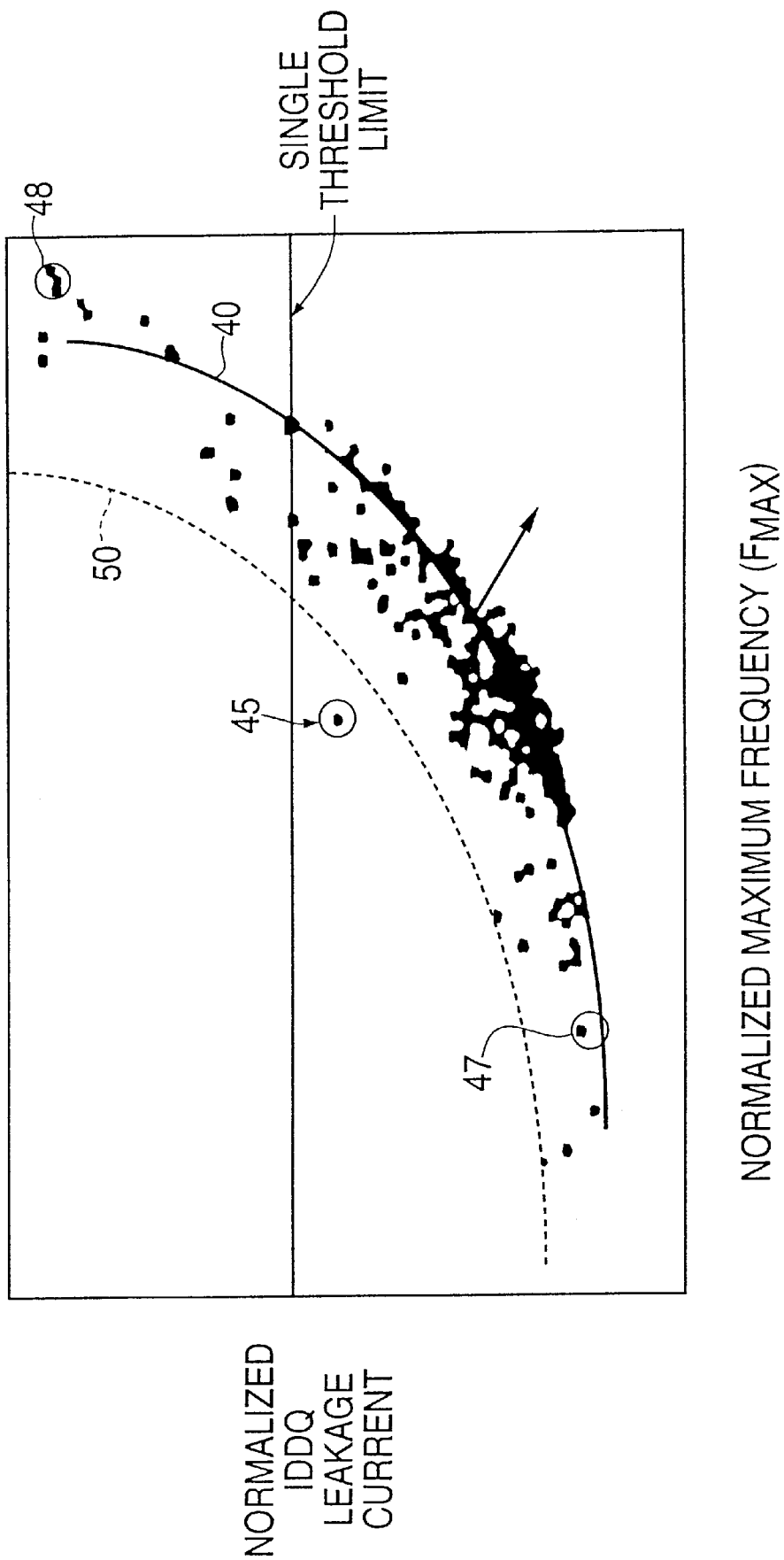
FIG. 4 is a plot of normalized IDDQ leakage current versus normalized maximum frequency (FMAX) in accordance with an example embodiment of the present invention.

FIG. 4 shows a plot of normalized IDDQ leakage current versus normalized maximum frequency (FMAX). The present invention will be described with respect to this and other plots of data. It is understood that these plots or graphs of data are illustrative of how the data may be visually represented. Other methods of presenting and representing the data are also within the scope of the present invention. The data may also be stored within the database 85 or other type of data storage unit. The processor may analyze this data as will be described below. The plots or graphs in the accompanying figures are shown so as to better illustrate features of the present invention.

In FIG. 4 (and FIGS. 7 and 8), the normalized maximum frequency (FMAX) may be represented along the horizontal axis while the normalized IDDQ leakage current may be represented along the vertical axis establishing the framework for two (i.e., multiple) parameter testing. In FIG. 4, the normalized IDDQ leakage current is provided along a logarithmic scale while the normalized maximum frequency is provided along a linear scale. This forms a semi-log plot or graph. The present invention is not limited to the presentation of the axes and scales as shown in FIG. 4.

In FIG. 4, each square point represents the individual data (i.e., the pair of IDDQ and FMAX data) for a single integrated circuit or other type of electronic device. FIG. 4 further shows a trend line 40 (fit to the data from a collection of ICs) that may be obtained by an analysis of the data on the graph or in the database 85. The trend line 40 may be obtained by averaging or any other means of fitting a curve to the data. For example, the trend line 40 may be obtained by calculating a mean (or medium) of all or a portion of the IDDQ and FMAX data within the database 85 or by using a least square fit of the data. Based on desired thresholds of the manufacturer or consumer, one may set an adjustable limit line 50 (i.e., establishing a multi-parameter threshold level) guard banded accordingly based on the trend line 40 (i.e., it follows the functional dependency and form as the trend line 40). In this example, the adjustable limit line 50 is parallel to the trend line 40. The operations to obtain the data, determine the trend line 40 and set the adjustable limit line 50 may be referred to as characterization or as characterization operations. This operation may be performed once prior to any actual testing of the IC or may be performed on a real-time basis. The larger the sample, the more confident one has about the trend line and test limit. For comparison purposes, FIG. 4 shows a single threshold limit used in disadvantageous embodiments to determine whether the IDDQ leakage current exceeds a single threshold limit. Embodiments of the present invention improve on this single threshold limit by using a multi-parameter threshold limit.

Subsequent to the characterization operations, measuring and testing operations may determine if an individual integrated circuit is defective based on a decision with respect to the adjustable limit line 50. The present invention also permits the measuring and testing operations to be performed simultaneously with the characterization operations although this is not necessary. In other words, the characterization operations may be performed on a real-time basis or our confidence may improve over time. Embodiments of the present invention may consider any integrated circuit (or electronic device) plotted within an area above or to the left of the adjustable limit line 50 to be defective as that integrated circuit's relationship of the IDDQ and FMAX data do not meet acceptable standards established intrinsically based on physics of device operation. Embodiments of the present invention may consider any integrated circuit (or electronic device) plotted within an area below or to the right of the adjustable limit line 50 to be acceptable as that integrated circuit's relationship of the IDDQ and FMAX data meet acceptable standards. These standards may be set by adjusting the trend line 40 to the location of the adjustable limit line 50. The amount of adjustment may be made by the user, by the testing device 80 (i.e., by the processor) or other type of computing device or by any combination thereof.

Examples of the measuring and testing operations will now be described. In these examples, the (speed) adjustable limit line 50 has already been determined in the characterization process. In a first example, the IDDQ and FMAX data for a first electronic device (such as an integrated circuit) are measured by the testing device 80 such as an IC tester. This data may be represented by the square data point 45 on the FIG. 4 graph. The processor performing the analysis compares the IDDQ and FMAX data of the first electronic device (represented as data point 45) with data of the (speed) adjustable limit line 50 (i.e., the multi-parameter threshold level). In this example, the processor determines that the IDDQ and FMAX data for the first electric device are outside the acceptable standards for this type of electronic device. This may be seen as the square data point 45 is above the (speed) adjustable limit line 50 in FIG. 4. The first electronic device is classified as defective and discarded so as not to be sold to a customer. As a comparison for a disadvantageous embodiment having the single threshold limit, the square point 45 would not be classified as defective since the point 45 is below the single threshold limit.

In a second and third example, the IDDQ and FMAX data for a second electronic device and a third electronic device may be measured by the testing device 80. This data may be represented by the square data points 47 and 48, respectively. The processor performing the analysis may compare the IDDQ and FMAX data of the second electronic device (represented as square data point 47) with data of the (speed) adjustable limit line 50 and may compare data of the third electronic device (represented as square data point 48) with data of the (speed) adjustable limit line 50. The processor determines that the IDDQ and FMAX data for the second and third electronic devices are both within acceptable standards for this type of electronic device. This may be seen as the points 47 and 48 are below or to the right of the (speed) adjustable limit line 50 shown in FIG. 4. As may be seen in FIG. 4, the data point 47 belongs to a slow and low leakage integrated circuit and the data point 48 belongs to a fast and leaky integrated circuit.

Embodiments of the present invention may use an integrated circuit's measured IDDQ and FMAX parameters (i.e., multi-level parameters) to determine if a device is defective. The multi-level parameters may be compared against IDDQ versus FMAX parameters (i.e., multi-parameter threshold level) as represented by the adjustable limit line 50 shown in FIG. 4. If for a given frequency (i.e., a given FMAX), an integrated circuit has a substantially higher leakage current than that forecasted, then the integrated circuit may be classified as defective. If for a given frequency (i.e., a given FMAX), an integrated circuit has a lower or as expected leakage current than that forecasted, then the integrated circuit may be considered acceptable.

Figure 5:
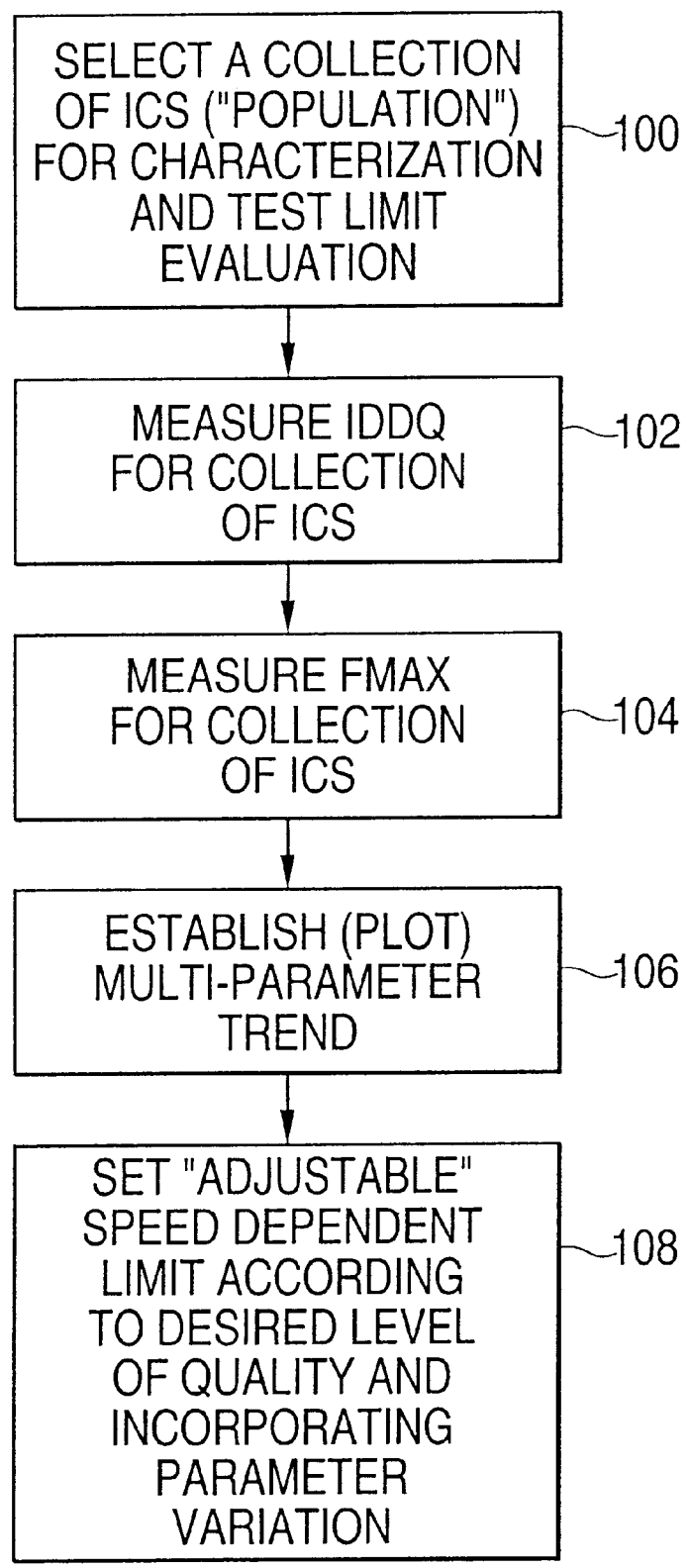
FIG. 5 is a flowchart showing characterization operations for setting a multiparameter threshold level in accordance with an example embodiment of the present invention.

FIG. 5 is a flowchart showing characterization operations for setting a multi-parameter threshold level (such as the adjustable limit line 50) in accordance with an example embodiment of the present invention. Other embodiments, operations and orders of operations are also within the scope of the present invention. In block 100, a collection of ICs ("population") may be selected for the characterization and test limit evaluation. The larger the "population" for characterization, the more confident the (speed) adjustable leakage limit. In block 102, the IDDQ leakage current may be measured for the collection of integrated circuits. In block 104, the operating speed (FMAX) may be measured for the collection of integrated circuits. Operations within the block 104 may occur prior to the operations of block 102, during the operations of block 102 or subsequent to the operations of block 104. The operations of block 102 and 104 occur for a plurality of integrated circuits so as to obtain IDDQ and FMAX data for each of the plurality of integrated circuits within the population. This data may be stored in the database 85 or other type of data storage unit. This data may be recorded in any number of forms, including but not limited to a graph such as shown in FIG. 4, a table or any other type of viable means to represent a distribution of data points.

In block 106, the processor may establish (or plot) a multi-parameter trend (such as the trend line 40) based on the data that has been accumulated within the database 85. In one embodiment, this may be obtained by averaging (or any other means of fitting a curve to the data) the IDDQ/FMAX data for the plurality of integrated circuits. Then in block 108, the user, the processor or any combination thereof may set the multi-parameter threshold level (such as the adjustable limit line 50) based on the multi-parameter trend calculated in block 106. The multi-parameter threshold level may then be used to determine whether individual integrated circuits exceed the acceptable standards. The multi-parameter trend (or adjustable limit) may be set according to a desired level of quality and incorporating parameter variation.

Figure 6:
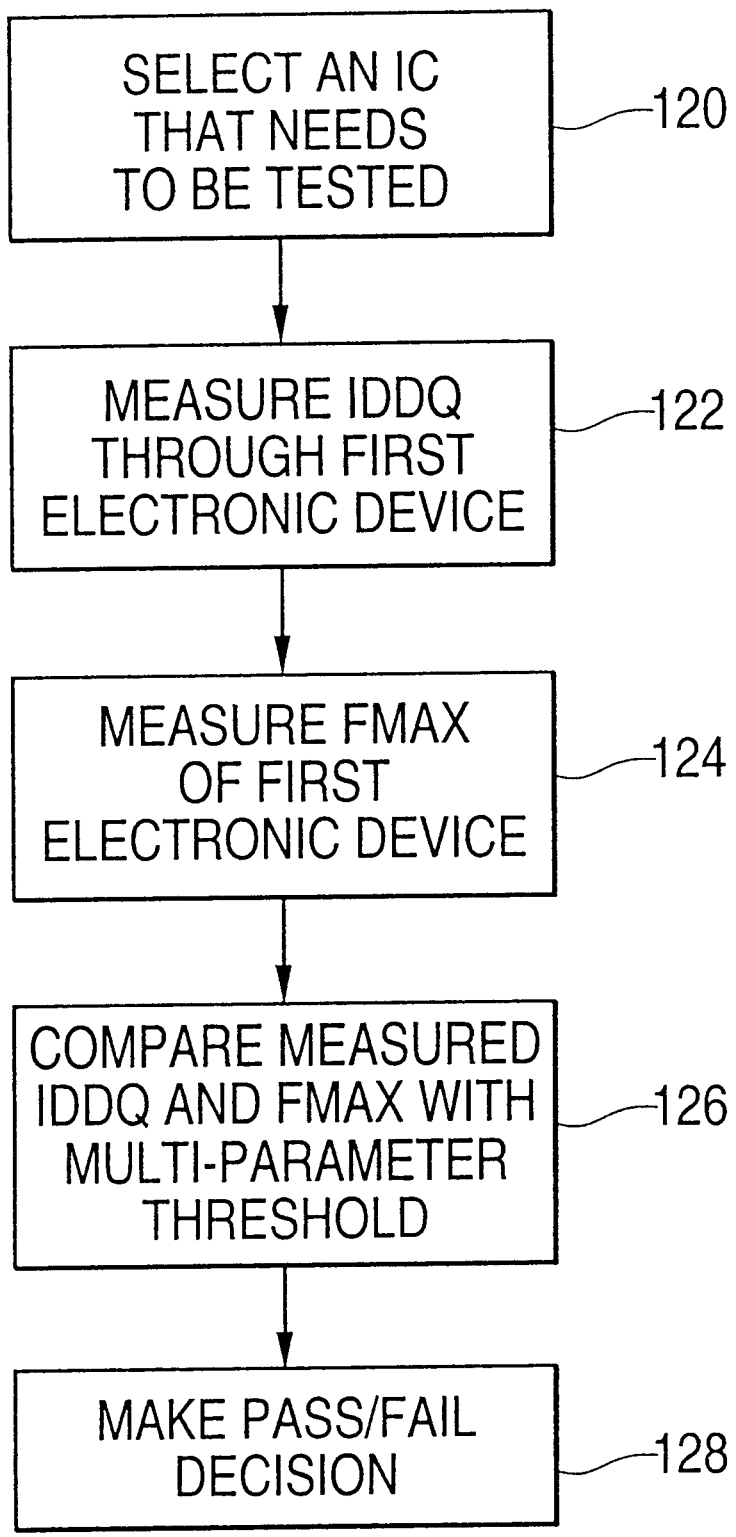
FIG. 6 is a flowchart showing operations for determining if an electronic device is defective in accordance with an example embodiment of the present invention.

FIG. 6 is a flowchart showing one embodiment for testing individual integrated circuits according to the present invention. Other embodiments, operations and orders of operations are also within the scope of the present invention. In block 120, an IC (hereinafter called a first electronic device) to be tested is selected. In block 122, the current (i.e., the IDDQ current) through the first electronic device may be measured. In block 124, the speed (FMAX) of the first electronic device may be measured. Operations within the block 122 may occur prior to operations of block 124, during operations of block 122 or subsequent to operations of block 122. In block 126, the processor may compare the measured current and the measured speed of the first electronic device with the multi-parameter threshold level. As discussed above, the multi-parameter threshold level may correspond to the adjustable limit line 50 shown in FIG. 4. Based on the comparison in block 126, the first electronic device may be classified as defective if it fails to meet the standards of the multi-parameter threshold level in block 128. For example, if for a given speed (i.e., a given frequency), the current of the first electronic device exceeds a certain current (i.e., the adjustable limit line 50), then the device is unacceptable and may be discarded. The first electronic device will not be classified as defective in block 128 if the device meets the standards of the multi-parameter threshold level. For example, if for a given speed (i.e., a given frequency), the current of the first electronic device is below a certain current (i.e., the adjustable limit line 50), then the device may be acceptable.

Embodiments of the above-described invention allow manufacturers to detect defect integrated circuits and to save fast integrated circuits. For example, in a disadvantageous single leakage current threshold limit as shown in FIG. 4, the IC corresponding to point 48 would be classified as defective because its leakage current is greater than the single threshold limit. In accordance with embodiments of the present invention, however, this IC may not be classified as defective. This faster IC is thereby saved from destruction.

This test in its current form with a (speed) adjustable leakage test limit has good sensitivity. However, to improve it even more, parameters such as transistor parameters may be altered. For example, transistor parameters may be altered by changing the body bias or the temperature of the electronic device under test. These will intrinsically change the leakage and frequency characteristics and hence will result in a different multiparameter trend and test limit. This two-step test decision greatly improves test sensitivity.

Embodiments of the present invention may perform characterization operations for two different conditions, namely a first condition and a second condition. For example, a first characterization operation may be performed on a plurality of integrated circuits under normal body bias to develop a first multi-parameter threshold level. A second characterization operation may be performed on the plurality of integrated circuits under reverse body bias to determine a second multi-parameter threshold level. Stated differently, two different characterization operations may be performed to set two multi-parameter threshold levels such as two adjustable limit lines. Reverse body bias increases the threshold of transistors and hence intrinsically lowers the IC leakage and slows down the IC.

An individual electronic device would be subjected to measurement and testing of IDDQ and FMAX under each of the two conditions (i.e., a first measurement and test under the normal body bias and a second measurement and test under the reverse body bias). The measurement results under normal body bias would be compared against the first multi-parameter threshold level and the measurement results under reverse body bias would be compared against the second multi-parameter threshold level. If either one of these two comparisons finds the device defective then the device may be discarded. By using two different conditions and performing two comparisons, sensitivity of the testing is further improved.

As another example, a first characterization operation may occur under a high temperature condition to determine a first multi-parameter threshold level and a second characterization operation may occur at a lower temperature (e.g., room temperature or below) condition to determine a second multi-parameter threshold level. When an individual electronic device undergoes measurement and testing, parameters of the electronic device are measured and tested at both the high temperature condition and the low temperature condition. Lowering the temperature reduces the IC leakage and speeds up the integrated circuit. The measured IDDQ/FMAX data at the high temperature is compared against the first multi-parameter threshold level and the measured IDDQ/FMAX data at the low temperature is compared against the second multi-parameter threshold level.

Under a normal body bias, a source and a body of an integrated circuit are provided at the same potential. In order to produce a reverse body bias, the source and body potentials of the electronic device are separated and a proper polarity bias may be applied to the body of the electronic device so as to make the source and body pn junction see a reverse bias across it. For example, in an NMOS transistor, the source and the drain are of n-type dopants, whereas the channel and substrate are of p-type dopants. The formed channel will be n-type. In order to produce a reverse body bias, the source and body are separated, and a negative voltage is applied to the body. The source is typically grounded. This produces a reverse body bias between the body and the source on the NMOS transistor. For a PMOS transistor, the source and drain are of p-type dopants and the well and substrate are of n-type dopants. The formed channel will be p-type. In order to produce a reverse body bias, the source and body are separated and a more positive voltage is applied to the body of the transistor. The source of the PMOS transistor is connected to $V_{DD}$, so the body will see a more positive potential than $V_{DD}$. This produces a reverse body bias between the body and the source on the PMOS transistor.

Figure 7:
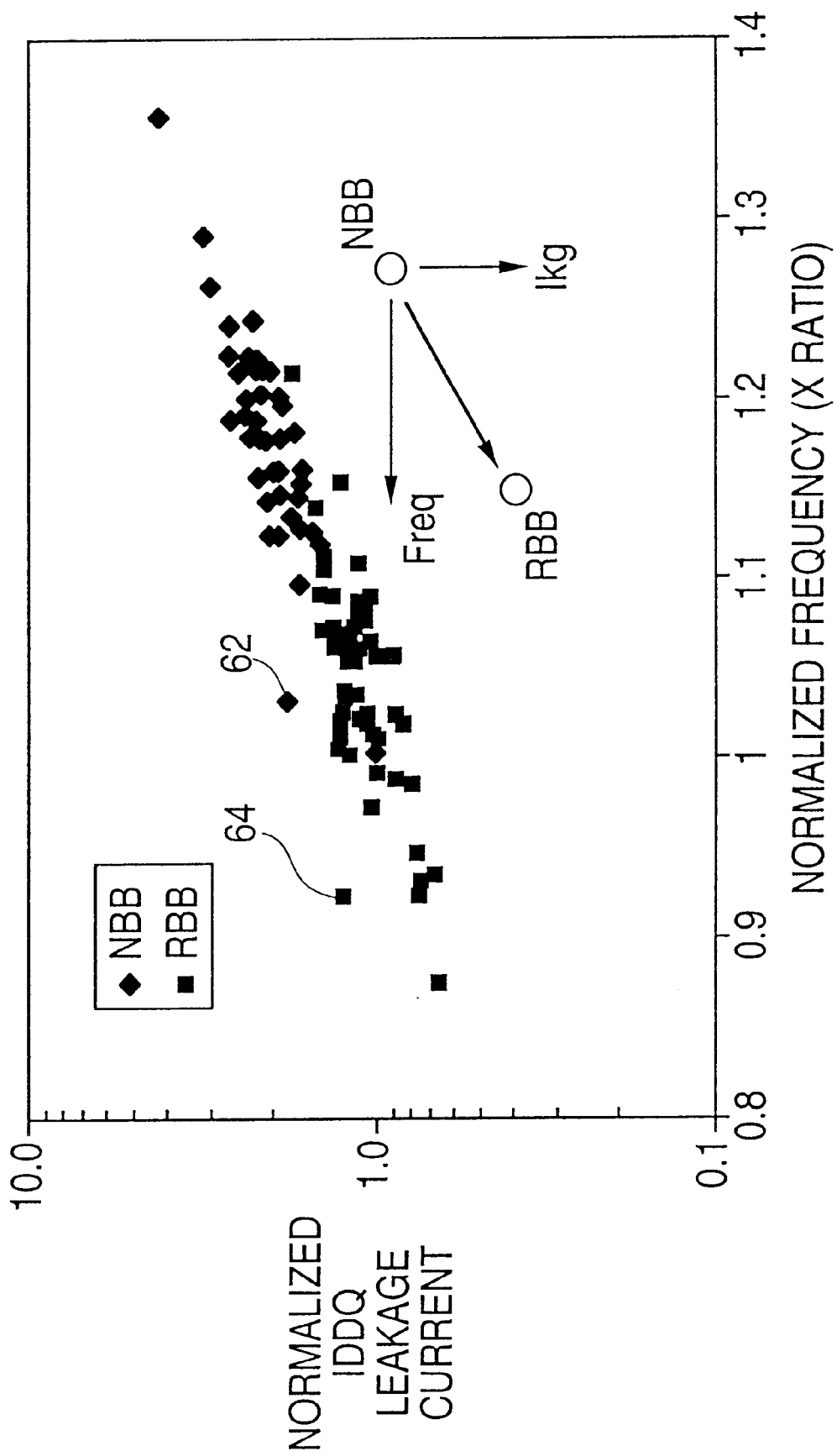
FIG. 7 is a plot of normalized IDDQ leakage current versus normalized frequency for normal body bias devices and reverse body bias devices in accordance with an example embodiment of the present invention.

By applying a reverse body bias to a transistor, the threshold voltage of the transistor is increased, which decreases the leakage current and slows down the transistor. For example, FIG. 7 shows a plot of normalized IDDQ leakage current versus normalized frequency for both normal body bias (NBB) devices and reverse body bias (RBB) devices in accordance with an example embodiment of the present invention. The triangular points represent electronic devices having a normal body bias and the square points represent electronic devices having a reverse body bias. For example, a point 62 represents the IDDQ and FMAX data for a first electronic device under normal body bias, whereas a point 64 represents the IDDQ and FMAX data for the first electronic device under reverse body bias. As may be seen from the graph and especially by the vector diagram in the lower right hand corner, an IDDQ/FMAX data point shifts when a reverse body bias is applied to the electronic device. That is, in this example, when a reverse body bias is applied to the electronic device, then the leakage current decreases and the frequency decreases. In this example, a 0.5 volt of reverse body bias may be applied as follows. In order to apply a 0.5 volt reverse body bias to the FIG. 1 embodiment, the body 21 and the source 22 of the PMOS transistor 20 are separated and a voltage of $V_{DD}$+0.5 volts is applied to the body 21. Further, the body 31 and the source 34 of the NMOS transistor 30 are separated and a voltage of $V_{DD}$−0.5 volts is applied to the body 31. On average, for all the integrated circuits tested, the leakage current was reduced by approximately two times, while the speed was reduced by approximately 10%.

Figure 8:
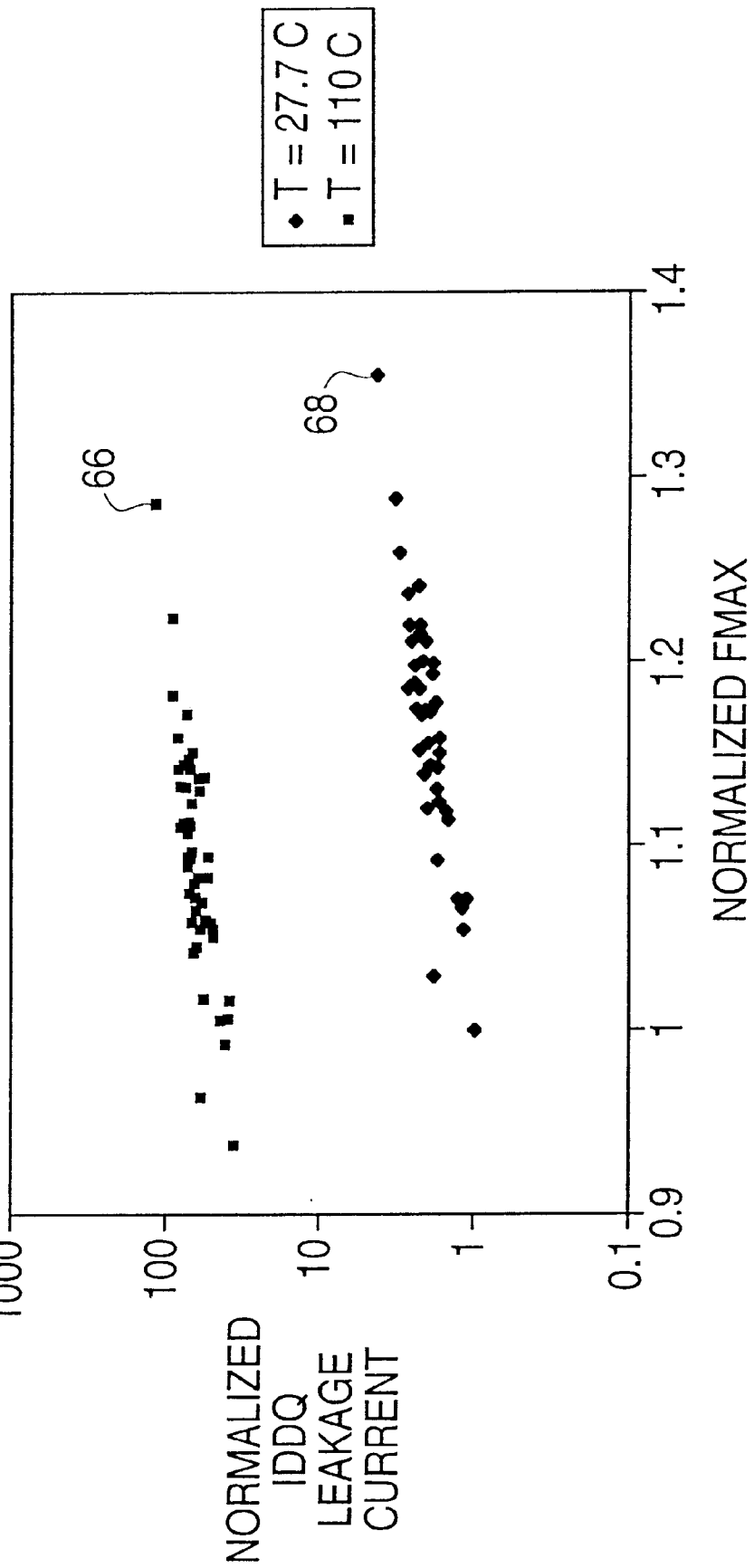
FIG. 8 is a plot of normalized IDDQ leakage current versus normalized frequency at a low temperature condition and at a high temperature condition in accordance with an example embodiment of the present invention.

FIG. 8 shows a plot of normalized IDDQ leakage current versus normalized frequency for both a low temperature (e.g., room temperature of 27° C.) condition and a high temperature (e.g., a hot temperature of 110° C.) condition in accordance with an example embodiment of the present invention. The square points represent electronic devices at a high temperature condition and the triangular points represent electronic devices at a low temperature condition. For example, a point 66 represents the IDDQ and FMAX data for a first electronic device at a high temperature (110°) condition, whereas a point 68 represents the IDDQ and FMAX data for the first electronic device at a low temperature (27° C.) condition. As may be seen from the graph, an IDDQ/FMAX data point shifts based on the temperature. That is, in this example, when the temperature increases, then so does the leakage current. The leakage is reduced by more than an order of magnitude (10×) and the IC speeds up by about 10%.

Figure 9:
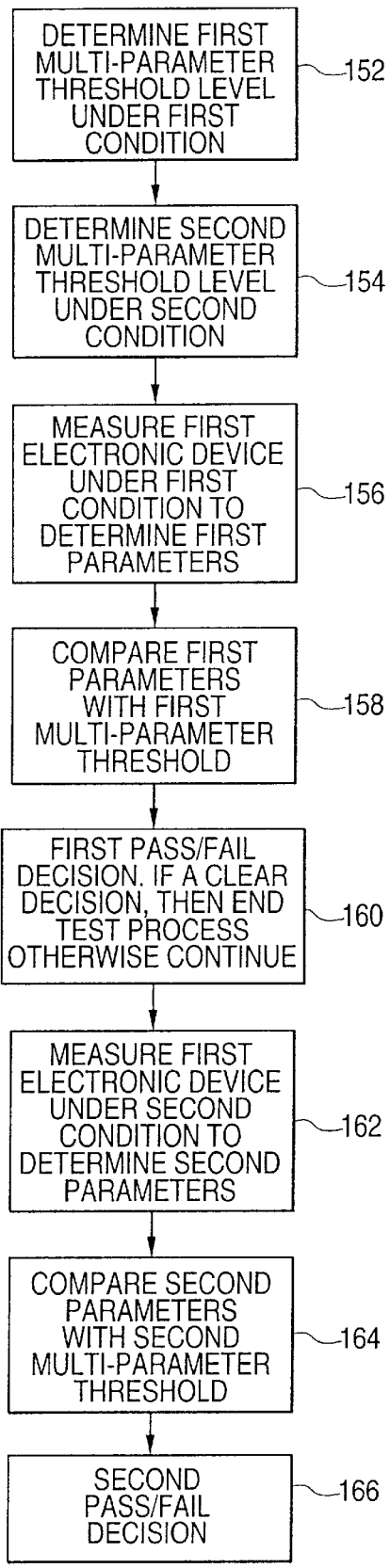
FIG. 9 is a flowchart showing operations for testing under two conditions in accordance with an example embodiment of the present invention.

FIG. 9 is a flowchart showing operations for testing under two conditions in accordance with an example embodiment of the present invention. Other embodiments, operations and orders of operations are also within the scope of the present invention. In block 152, a first multi-parameter threshold level may be determined under a first condition. This may correspond to determining an adjustable limit line for electronic devices having a normal body bias or measured at a first temperature. The determination of the first multi-parameter threshold level may be done using the method shown in FIG. 5. In block 154, a second multi-parameter threshold level may be determined under a second condition. This may correspond to determining an adjustable limit line for electronic devices having a reverse body bias or measured at a second temperature. The determination of the second multi-parameter threshold level may also be done using the method shown in FIG. 5.

In block 156, a first electronic device may be measured under the first condition to determine first parameters. For example, parameters of the first electronic device under normal body bias may be measured to determine the IDDQ and FMAX data. In block 158, the first parameters may be compared with the first multi-parameter threshold level. For example, the IDDQ and FMAX parameters determined in block 156 may be compared against the first multi-parameter threshold level (such as the adjustable limit line) determined in block 152. In a similar manner to that discussed above with respect to FIG. 6, if the first parameters do not meet the standards set by the first multi-parameter threshold level (i.e., the decision is clear), then the device may be considered defective in block 160 and the testing may end. However, if the decision regarding whether the device is defective is not clear, then the testing process may proceed to block 162. Block 160 may be considered a first pass/fail decision.

In block 162, the first electronic device may be measured under the second condition to determine second parameters. For example, parameters of the first electronic device under reverse body bias may be measured to determine the IDDQ and FMAX data. The measurements within block 162 need not re-measure the speed of the integrated circuit. Rather, only the leakage current may be measured under the second condition. In order to improve the sensitivity testing, in block 164, the second parameters may be compared with the second multi-parameter threshold level. For example, the IDDQ (and FMAX) parameter(s) determined in block 164 may be compared against the second multi-parameter threshold level (such as the adjustable limit line) determined in block 154. A similar type of pass/fail decision may be made in block 166. For example, if the second parameters do not meet the standards set by the second multi-parameter threshold level, then the device may be considered defective. Block 166 may be considered a second pass/fail decision.

Embodiments of the present invention provide additional sensitivity by testing electronic devices under different conditions such as different body bias conditions or different temperature conditions. Other testing conditions are also within the scope of the present invention.

Further, the improved sensitivity may be provided without any significant cost for testing. The IDDQ is currently being measured and the FMAX is currently being measured so additional test equipment or test time may not be required. In other words, additional time and equipment is not necessary for the gathering of the data.

This concludes the description of the example embodiments. Although the present invention has been described with reference to a number of illustrative embodiments, it should be understood that numerous other modifications and embodiments can be devised by those skilled in the art that fall within the spirit and scope of the present invention. More particularly, reasonable variations and modifications are possible in the component parts and/or arrangements of the subject combination arrangement within the scope of the foregoing disclosure, the drawings and the appended claims without departing from the spirit of the invention. That is, various other modifications and changes may occur to those skilled in the art without departing from the spirit and scope of the invention.

What is claimed is:

1. A method of testing electronic devices on a chip comprising:
   measuring current through a first one of said electronic devices;
   measuring speed of said first one of said electronic devices; and
   determining whether said first one of said electronic devices is defective by comparing said measured current and said measured speed with a first multi-parameter threshold level.

2. The method of claim 1, wherein said current comprises leakage current.

3. The method of claim 1, wherein said speed comprises a maximum operating frequency.

4. The method of claim 1, wherein said current and said speed are both measured under a first condition and are compared with said first multi-parameter threshold level determined under said first condition.

5. The method of claim 4, further comprising:
   measuring current through said first one of said electronic devices under a second condition;
   measuring speed of said first one of said electronic devices under said second condition; and
   determining whether said first one of said electronic devices is defective by comparing said measured current and said measured speed of said first one of said electronic devices under said second condition with a second multi-parameter threshold level determined under said second condition.

6. The method of claim 5, wherein the first condition comprises a normal body bias condition and said second condition comprises a reverse body bias condition.

7. The method of claim 5, wherein said first condition comprises a first temperature condition and said second condition comprises a second temperature condition.

8. The method of claim 1, further comprising determining said first multi-parameter threshold level.

9. The method of claim 8, wherein said first multi-parameter threshold level is determined by:
   measuring current through each of a plurality of said electronic devices;
   measuring speed of each of said plurality of said electronic devices;
   determining a multi-parameter trend based on said measured current and said measured speed of each of said plurality of said electronic devices; and
   adjusting said multi-parameter trend to determine said first multi-parameter threshold level.

10. A method of testing electronic devices on a chip comprising:
    measuring current through a first electronic device;
    measuring speed of said first electronic device; and
    comparing said measured current and said measured speed of said first electronic device with a first multi-parameter threshold.

11. The method of claim 10, further comprising determining if said first electronic device is defective based on said comparing.

12. The method of claim 10, wherein said current comprises leakage current.

13. The method of claim 10, wherein said speed comprises a maximum operating frequency.

14. The method of claim 10, wherein said current and said speed are both measured under a first condition and are compared with said first multi-parameter threshold determined under said first condition.

15. The method of claim 14, further comprising:
    measuring current through said first electronic device under a second condition;
    measuring speed of said first electronic devise under said second condition; and
    comparing said measured current and said measured speed of said first electronic device under said second condition with a second multi-parameter threshold determined under said second condition.

16. The method of claim 15, wherein the first condition comprises a normal body bias condition and said second condition comprises a reverse body bias condition.

17. The method of claim 15, wherein said first condition comprises a first temperature condition and said second condition comprises a second temperature condition.

18. The method of claim 10, further comprising determining said first multi-parameter threshold.

19. The method of claim 18, wherein said first multi-parameter threshold is determined by:
measuring current through each of a plurality of said electronic devices;
measuring speed of each of said plurality of said electronic devices;
determining a multi-parameter trend based on said measured current and said measured speed of each of said plurality of said electronic devices; and
adjusting said multi-parameter trend to determine said first multi-parameter threshold.

20. A device for testing electronic devices on a chip, said device comprising:
a testing device that measures a current through a first electronic device on said chip and that measures a speed of said first electronic device; and
a comparing device coupled to said testing device to receive data relating to said measured current and said measured speed of said first electronic device, said comparing device to compare said data with a first multi-parameter threshold level.

21. The device of claim 20, wherein said comparing device determines if said first electronic device is defective based on said comparing.

22. The device of claim 20, wherein said current comprises leakage current.

23. The device of claim 20, wherein said speed comprises a maximum operating frequency.

24. The device of claim 23, wherein said current and said speed are both measured under a first condition and are compared with said first multi-parameter threshold level determined under said first condition.

25. The device of claim 24, further comprising:
measuring current through said first electronic device under a second condition;
measuring speed of said first electronic device under said second condition; and
determining whether said first electronic device is defective by comparing said measured current and said measured speed of said first electronic device under said second condition with a second multi-parameter threshold level determined under said second condition.

26. The device of claim 25, wherein the first condition comprises a normal body bias and said second condition comprises a reverse body bias condition.

27. The device of claim 25, wherein said first condition comprises a first temperature condition and said second condition comprises a second temperature condition.

* * * * *